(12) United States Patent
Kawaguchi et al.

(10) Patent No.: US 9,023,744 B2
(45) Date of Patent: May 5, 2015

(54) ALKALI-FREE GLASS

(75) Inventors: Takahiro Kawaguchi, Shiga (JP); Shinkichi Miwa, Shiga (JP)

(73) Assignee: Nippon Electric Glass Co., Ltd., Shiga (JP)

( * ) Notice: Subject to any disclaimer, the term of this patent is extended or adjusted under 35 U.S.C. 154(b) by 100 days.

(21) Appl. No.: 13/817,196

(22) PCT Filed: Aug. 10, 2011

(86) PCT No.: PCT/JP2011/068252
§ 371 (c)(1),
(2), (4) Date: Mar. 19, 2013

(87) PCT Pub. No.: WO2012/023470
PCT Pub. Date: Feb. 23, 2012

(65) Prior Publication Data
US 2013/0244859 A1 Sep. 19, 2013

(30) Foreign Application Priority Data
Aug. 17, 2010 (JP) .................. 2010-182068

(51) Int. Cl.
*C03C 3/087* (2006.01)
*C03C 3/091* (2006.01)
*H01L 51/00* (2006.01)
*H01L 51/52* (2006.01)

(52) U.S. Cl.
CPC ............... *C03C 3/091* (2013.01); *C03C 3/087* (2013.01); *H01L 51/0096* (2013.01); *H01L 51/52* (2013.01); *H01L 2251/55* (2013.01); *H01L 2251/556* (2013.01)

(58) Field of Classification Search
CPC ...... C03C 3/091; C03C 3/087; H01L 51/0096
USPC .......................................................... 501/66
See application file for complete search history.

(56) References Cited

U.S. PATENT DOCUMENTS

| | | | |
|---|---|---|---|
| 5,116,787 A | 5/1992 | Dumbaugh, Jr. | |
| 5,116,788 A | 5/1992 | Dumbaugh, Jr. | |
| 5,244,847 A * | 9/1993 | Kushitani et al. | 501/66 |
| 5,489,558 A | 2/1996 | Moffatt et al. | |
| 5,508,237 A * | 4/1996 | Moffatt et al. | 501/69 |
| 6,069,100 A * | 5/2000 | Naumann et al. | 501/67 |
| 7,211,957 B2 * | 5/2007 | Bergmann et al. | 313/636 |
| 8,324,123 B2 * | 12/2012 | Shimada et al. | 501/69 |
| 8,455,378 B2 * | 6/2013 | Yanase et al. | 501/66 |
| 2002/0011080 A1 | 1/2002 | Naka et al. | |
| 2003/0121288 A1 | 7/2003 | Naka et al. | |
| 2004/0070327 A1 | 4/2004 | Bergmann et al. | |
| 2007/0191207 A1 | 8/2007 | Danielson et al. | |
| 2008/0130171 A1 * | 6/2008 | Behan et al. | 360/131 |
| 2010/0129944 A1 * | 5/2010 | Shimada et al. | 438/27 |
| 2013/0237401 A1 * | 9/2013 | Kawaguchi et al. | 501/66 |

FOREIGN PATENT DOCUMENTS

| | | | |
|---|---|---|---|
| CN | 1445187 | | 10/2003 |
| DE | 100 22 769 | | 11/2001 |
| EP | 0510544 | * | 10/1992 |
| EP | 0559389 | * | 9/1993 |
| EP | 0672629 | * | 9/1995 |
| EP | 2001106546 | * | 4/2001 |
| JP | 4-175242 | | 6/1992 |
| JP | 6-144963 | | 5/1994 |
| JP | 8-109037 | | 4/1996 |
| JP | 2002-3240 | | 1/2002 |
| JP | 2002003240 | * | 1/2002 |
| JP | 2006169107 | * | 6/2006 |
| JP | 2009-525942 | | 7/2009 |
| WO | 0156941 | * | 8/2001 |

OTHER PUBLICATIONS

International Preliminary Report on Patentability and Written Opinion issued Mar. 19, 2013 in International (PCT) Application No. PCT/JP2011/068252.
International Search Report issued Sep. 6, 2011 in International (PCT) Application No. PCT/JP2011/068252.
Office Action mailed Aug. 12, 2014 in corresponding Chinese Application No. 201180039911.X, with partial English translation thereof.
Supplementary European Search Report issued Sep. 4, 2014 in European Application No. 11818112.2.

* cited by examiner

*Primary Examiner* — Karl Group
(74) *Attorney, Agent, or Firm* — Wenderoth, Lind & Ponack, L.L.P.

(57) ABSTRACT

Provided is an alkali-free glass, which is substantially free of alkali metal oxides, and has a strain point of more than 680° C., an average coefficient of thermal expansion in the temperature range of 30 to 380° C. of 40 to $55 \times 10^{-7}/°$ C., and a liquidus temperature of less than 1,200° C. Further, the alkali-free glass comprises, as a glass composition in terms of mass %, 55 to 70% of $SiO_2$, 10 to 20% of $Al_2O_3$, 0.1 to 4.5% of $B_2O_3$, 0 to 1% of MgO, 5 to 15% of CaO, 0.5 to 5% of SrO, and 5 to 15% of BaO.

16 Claims, No Drawings

ALKALI-FREE GLASS

TECHNICAL FIELD

The present invention relates to an alkali-free glass, and more particularly, to an alkali-free glass suitable for an OLED display.

BACKGROUND ART

Electronic devices such as an OLED display, which are thin, excellent in moving picture display performance, and low in power consumption, are used for applications such as a display for a portable phone.

A glass sheet is widely used as a substrate for an OLED display. A glass sheet used for this application needs to have the following main characteristics.
(1) To be substantially free of alkali metal oxides in order to prevent alkali ions from diffusing in a semiconductor film formed in a heat treatment process.
(2) To be excellent in productivity and be excellent particularly in denitrification resistance and meltability in order to produce a glass sheet at low cost.
(3) To have a high strain point in order to reduce heat shrinkage of a glass sheet in a production process for a p-Si.TFT.

The characteristic (3) is described in detail. The production process for a p-Si.TFT involves a heat treatment process at 400 to 600° C., and the heat treatment process causes a minute dimensional change, called heat shrinkage, in the glass sheet. When the heat shrinkage is significant, a pixel pitch shift occurs in the TFT, which causes a display defect. Along with emergence of a higher-definition display, even a dimensional shrinkage of about several ppm may cause a display defect. Accordingly, there is a demand for a low-heat-shrinkage glass sheet. Note that as a temperature of heat treatment to be applied to the glass sheet is higher, the dimensional shrinkage becomes larger.

As a method of reducing heat shrinkage of a glass sheet, there is known a method involving forming a glass sheet and applying annealing treatment to the glass sheet at around its annealing point. However, the annealing treatment requires a long time period, and hence production cost of the glass sheet soars.

As another method, there is known a method involving increasing a strain point of a glass sheet. The strain point is a characteristic which serves as an index of heat resistance. As the strain point is higher, the heat shrinkage is more unlikely to occur in the production process for a p-Si.TFT. For example, Patent Literature 1 discloses a glass sheet having a high strain point.

CITATION LIST

Patent Literature 1: JP 2009-525942 W

SUMMARY OF INVENTION

Technical Problem

Meanwhile, an OLED display is constructed of two glass sheets, a cathode such as a metal, an organic light-emitting layer, an anode such as ITO, a sealing material, and the like.

Conventionally, an organic resin such as an epoxy resin has been used as the sealing material. However, an organic resin-based material has a problem in that the organic light-emitting layer is deteriorated because the material has low barrier properties against oxygen and moisture (gas barrier properties). Accordingly, studies have been vigorously conducted to increase air-tightness of an inside of the display through use of a glass sealing material, and this technology has already been put to practical use in some OLED displays.

The glass sealing material tends to have a higher coefficient of thermal expansion as its melting point is lower. In general, the coefficient of thermal expansion of the glass sealing material is 60 to $80 \times 10^{-7}$/° C. On the other hand, the glass sheet tends to have a lower coefficient of thermal expansion as its strain point is higher. In general, the coefficient of thermal expansion of the glass sheet is less than $40 \times 10^{-7}$/° C. (see Patent Literature 1). At present, as described above, the coefficients of thermal expansion of the glass sealing material and the glass sheet largely differ from each other. Therefore, the glass sheet for an OLED display needs to have a coefficient of thermal expansion matched with that of the glass sealing material in addition to the above-mentioned characteristics (1) to (3). When the coefficients of thermal expansion of the glass sealing material and the glass sheet largely differ from each other, a stress to be applied to a sealing portion becomes large. As a result, the sealing portion is liable to undergo stress fracture, and hence the air-tightness of the inside of the display is difficult to secure. As a method of suppressing the stress fracture, there is known a method involving adding a large amount of a low-expansion filler to the glass sealing material. However, the addition of the low-expansion filler in an excessive amount causes a reduction in flowability of the glass sealing material, and hence sealing failure is liable to occur. As a result, the air-tightness of the inside of the display is difficult to secure. Thus, it has been difficult to match the coefficient of thermal expansion of the glass sheet with that of the glass sealing material while increasing the strain point so as to secure the air-tightness of the inside of the display.

In view of the foregoing, a technical object of the present invention is to invent an alkali-free glass, which is excellent in productivity (in particular, denitrification resistance), has a coefficient of thermal expansion matched with that of a glass sealing material, and has a high strain point, to thereby secure the air-tightness of the inside of an OLED display and to reduce heat shrinkage of the glass sheet in a production process for a p-Si.TFT while reducing production cost of the glass sheet.

Solution to Problem

The inventors of the present invention have repeatedly performed various experiments. As a result, the inventors have found that the technical object can be achieved by restricting glass characteristics of an alkali-free glass within predetermined ranges. Thus, the inventors propose the finding as the present invention. That is, an alkali-free glass of the present invention is substantially free of alkali metal oxides, and has a strain point of more than 680° C., an average coefficient of thermal expansion in the temperature range of 30 to 380° C. of 40 to $60 \times 10^{-7}$/° C., and a liquidus temperature of less than 1,220° C. Herein, the phrase "substantially free of alkali metal oxides" refers to a case where a content of alkali metal oxides ($Li_2O$, $Na_2O$, and $K_2O$) in a glass composition is 1,000 ppm (by mass) or less. The term "strain point" refers to a value obtained by measurement based on the method in accordance with ASTM C336. Note that the "average coefficient of thermal expansion in the temperature range of 30 to 380° C." may be measured with a dilatometer or the like. The "liquidus temperature" may be calculated by measuring a temperature at which crystals are deposited after glass powders that passed through a standard 30-mesh sieve (500 μm) and remained on a 50-mesh sieve (300 μm) are placed in a platinum boat and then kept for 24 hours in a gradient heating furnace.

Second, the alkali-free glass of the present invention comprises, as a glass composition in terms of mass %, 55 to 70% of $SiO_2$, 10 to 20% of $Al_2O_3$, 0.1 to 4.5% of $B_2O_3$, 0 to 1% of MgO, 5 to 15% of CaO, 0.5 to 5% of SrO, and 5 to 15% of BaO.

Third, the alkali-free glass of the present invention has a molar ratio $SiO_2/Al_2O_3$ of 4.5 to 8.

Fourth, the alkali-free glass of the present invention has a molar ratio CaO/BaO of 0.5 to 10.

Fifth, the alkali-free glass of the present invention further comprises 0.001 to 1 mass % of $SnO_7$.

Sixth, the alkali-free glass of the present invention has a temperature at $10^{2.5}$ poise of 1,660° C. or less. Note that the "temperature at $10^{2.5}$ poise" may be measured by a platinum sphere pull up method.

Seventh, the alkali-free glass of the present invention has a viscosity at a liquidus temperature of $10^{4.8}$ poise or more. Note that the "viscosity at a liquidus temperature" may be measured by a platinum sphere pull up method.

Eighth, the alkali-free glass of the present invention is formed by an overflow down-draw method.

Ninth, the alkali-free glass of the present invention is used for an OLED device, in particular, an OLED display.

DESCRIPTION OF EMBODIMENTS

An alkali-free glass according to an embodiment of the present invention is substantially free of alkali metal oxides, and has a strain point of more than 680° C., an average coefficient of thermal expansion in the temperature range of 30 to 380° C. of 40 to $60\times10^{-7}/°$ C., and a liquidus temperature of less than 1,220° C. The reasons why the glass characteristics are limited as described above are described below.

The alkali-free glass according to this embodiment has a strain point of more than 680° C., preferably 690° C. or more, more preferably 700° C. or more, still more preferably 710° C. or more. With such strain point, it is possible to suppress the heat shrinkage of a glass substrate in a production process for a p-Si.TFT.

The alkali-free glass according to this embodiment has an average coefficient of thermal expansion in the temperature range of 30 to 380° C. of 40 to $60\times10^{-7}/°$ C., preferably 40 to $55\times10^{-7}/°$ C. (excluding $40\times10^{-7}/°$ C.), more preferably 40 to $50\times10^{-7}/°$ C., still more preferably 40 to $48\times10^{-7}/°$ C., particularly preferably 42 to $48\times10^{-7}/°$ C., most preferably 42 to $46\times10^{-7}/°$ C. With such value, the coefficient of thermal expansion of the alkali-free glass can be easily matched with that of a glass sealing material. Accordingly, the stress fracture of a sealing portion can be suppressed, and a panel can endure thermal shock such as rapid heating and rapid cooling in the panel production process, resulting in enhanced throughput of panel production. On the other hand, when the average coefficient of thermal expansion in the temperature range of 30 to 380° C. is less than $40\times10^{-7}/°$ C., the coefficient of thermal expansion of the alkali-free glass is difficult to match with that of a glass sealing material, and hence stress fracture is liable to occur at the sealing portion. Further, when the average coefficient of thermal expansion in the temperature range of 30 to 380° C. is more than $60\times10^{-7}/°$ C., the thermal shock resistance lowers, which may result in reduced throughput of the panel production process. Note that in an OLED display, a metal member (electrode or the like) has a higher coefficient of thermal expansion than that of a glass sheet like a glass sealing material. Thus, the regulation of the average coefficient of thermal expansion in the temperature range of 30 to 380° C. within the above-mentioned range is of a huge significance from the viewpoint of the prevention of detachment of the metal member as well.

The alkali-free glass according to this embodiment has a liquidus temperature of less than 1,220° C., preferably 1,200° C. or less, more preferably 1,190° C. or less, still more preferably 1,180° C. or less. With such liquidus temperature, a situation in which a devitrified crystal is generated during glass production to decrease productivity is easily prevented. Further, the glass can be easily formed into a glass sheet by an overflow down-draw method, with the result that the surface quality of the glass sheet can be easily improved, and thus the production cost of the glass sheet can be lowered. Note that the liquidus temperature is an index of denitrification resistance, and as the liquidus temperature of glass is lower, the glass is more excellent in devitrification resistance.

The alkali-free glass according to this embodiment has a temperature at $10^{2.5}$ poise of preferably 1,660° C. or less, 1,650° C. or less, particularly preferably 1,640° C. or less. If the temperature at $10^{2.5}$ poise becomes high, the glass is difficult to dissolve, and as a result, the production cost of a glass sheet soars. Note that the temperature at $10^{2.5}$ poise corresponds to the melting temperature, and as the temperature is lower, the meltability is more excellent.

The alkali-free glass according to this embodiment has a viscosity at a liquidus temperature of preferably $10^{4.8}$ poise or more, $10^{5.0}$ poise or more, $10^{5.2}$ poise or more, particularly preferably $10^{5.5}$ poise or more. With such viscosity, the devitrification of the glass hardly occurs during shape formation, and hence the glass can be easily formed into a glass sheet by an overflow down-draw method, with the result that the surface quality of the glass sheet can be enhanced, and the production cost of the glass sheet can be lowered. Note that the liquidus viscosity is an index of formability, and as the liquidus viscosity is higher, the formability is more excellent.

The alkali-free glass according to this embodiment preferably comprises, as a glass composition in terms of mass %, 55 to 70% of $SiO_2$, 10 to 20% of $Al_2O_3$, 0.1 to 4.5% of $B_2O_3$, 0 to 1% of MgO, 5 to 15% of CaO, 0.5 to 5% of SrO, and 5 to 15% of BaO. The reasons why the content of each component is limited as described above are described below. Note that in the description of the content of each component, the expression "%" means "mass %."

$SiO_2$ is a component that forms the skeleton of glass. The content of $SiO_2$ is preferably 55 to 70%, 55 to 68%, particularly preferably 58 to 65%. When the content of $SiO_2$ is less than 55%, it becomes difficult to increase a strain point. Further, acid resistance lowers and a density becomes too high. On the other hand, when the content of $SiO_2$ is more than 70%, a viscosity becomes higher and meltability lowers, and moreover devitrified crystals of cristobalite and the like are liable to precipitate and a liquidus temperature increases.

$Al_2O_3$ is a component that forms the skeleton of glass, is a component that increases the strain point, and moreover, is a component that suppresses phase separation. The content of $Al_2O_3$ is preferably 10 to 20%, 12 to 20%, particularly preferably 14 to 20%. When the content of $Al_2O_3$ is less than 10%, the strain point lowers, and the glass is liable to undergo phase separation. On the other hand, when the content of $Al_2O_3$ is more than 20%, devitrified crystals of mullite, anorthite, and the like are liable to precipitate, and the liquidus temperature increases.

A molar ratio $SiO_2/Al_2O_3$ is a component ratio that is important for achieving both a high strain point and high denitrification resistance. As described above, both the components have effects of increasing the strain point. However, when the amount of $SiO_2$ becomes relatively large, devitrified crystals of cristobalite and the like are liable to precipitate. On the other hand, when the amount of $Al_2O_3$ becomes relatively large, alkaline earth aluminosilicate-based devitrified crystals of mullite, anorthite, and the like are liable to precipitate. Thus, the molar ratio $SiO_2/Al_2O_3$ is preferably 4.5 to 8, 4.5 to 7, 5.5 to 7, particularly preferably 6 to 7.

$B_2O_3$ is a component that enhances the meltability and enhances devitrification resistance. The content of $B_2O_3$ is preferably 0.1 to 4.5%, 0.1 to 4%, 0.1 to 3.5%, particularly preferably 0.1 to 3%. When the content of $B_2O_3$ is less than 0.1%, the effect of suppressing devitrification lowers, and the liquidus temperature increases. In addition, the function of $B_2O_3$ as a melting accelerate component becomes insufficient and buffered hydrofluoric acid resistance (BHF resistance) lowers. On the other hand, when the content of $B_2O_3$ is more than 4.5%, the strain point lowers and the acid resistance lowers.

MgO is a component that lowers the viscosity and enhances the meltability. The content of MgO is preferably 0 to 1%, 0 to 0.8%, 0.1 to 0.8%, particularly preferably 0.1 to 0.5%. When the content of MgO is more than 1%, the devitrification resistance is liable to lower, and the coefficient of thermal expansion becomes too low, resulting in too large a difference from the coefficient of thermal expansion of a glass sealing material.

CaO is a component that lowers the viscosity and remarkably enhances the meltability without lowering the strain point, and is also a component that effectively enhances the coefficient of thermal expansion. Further, a raw material for introducing CaO is relatively inexpensive among those for alkaline earth metal oxides, and hence is CaO a component that lowers raw material cost. The content of CaO is preferably 5 to 15%, 5 to 12%, 5 to 10%, particularly preferably 5 to 8%. When the content of CaO is less than 5%, it becomes difficult to receive the benefit of the effects. On the other hand, when the content of CaO is more than 15%, the glass is liable to denitrify and the coefficient of thermal expansion becomes too high.

SrO is a component that suppresses the phase separation of glass and enhances the devitrification resistance. SrO is also a component that lowers the viscosity and enhances the meltability without lowering the strain point, and moreover, is a component that suppresses the elevation of the liquidus temperature. The content of SrO is preferably 0.5 to 5%, 0.5 to 4%, particularly preferably 0.5 to 3.5%. When the content of SrO is less than 0.5%, it becomes difficult to receive the benefit of the effects of suppressing the phase separation and enhancing the devitrification resistance. On the other hand, when the content of SrO is more than 5%, strontium silicate-based devitrified crystals are liable to precipitate and the devitrification resistance is liable to lower.

BaO is a component that remarkably enhances the devitrification resistance among alkaline earth metal oxides. The content of BaO is preferably 5 to 15%, 5 to 14%, 5 to 13%, particularly preferably 5 to 12%. When the content of BaO is less than 5%, the liquidus temperature increases and the devitrification resistance lowers. On the other hand, when the content of BaO is more than 15%, the viscosity becomes too high and the meltability lowers, and moreover devitrified crystals containing BaO are liable to precipitate and the liquidus temperature increases.

A molar ratio CaO/BaO is a component ratio that is important for achieving both a high strain point and high devitrification resistance and for reducing the production cost of a glass sheet. The molar ratio CaO/BaO is preferably 0.5 to 10, 1 to 9, 1.5 to 8, 1.5 to 7, particularly preferably 1.8 to 6. When the molar ratio CaO/BaO is less than 0.5, the viscosity becomes too high and the raw material cost is liable to soar. On the other hand, when the molar ratio CaO/BaO is more than 10, the liquidus temperature increases and the devitrification resistance lowers, with the result that it becomes difficult to form a glass sheet.

In addition to the above-mentioned components, for example, the following components, may be added. Note that the total content of the components except the above-mentioned components is preferably 10% or less, particularly preferably 5% or less, from the standpoint of surely receiving the benefit of the effects of this embodiment.

$SnO_2$ is a component that has a good fining action in a high temperature range, is a component that increases the strain point, and is a component that lowers the viscosity. The content of $SnO_2$ is preferably 0 to 1%, 0.001 to 1%, 0.01 to 0.5%, particularly preferably 0.05 to 0.3%. When the content of $SnO_2$ is more than 1%, a devitrified crystal of $SnO_2$ is liable to precipitate. Note that, when the content of $SnO_2$ is less than 0.001%, it becomes difficult to receive the benefit of the effects.

As described above, $SnO_2$ is suitable as a fining agent. In addition, it is possible to add, as a fining agent, $F_2$, $Cl_2$, $SO_3$, C, or metal powder of Al, Si, or the like up to 5%, as long as the characteristics of glass are not impaired. Besides, it is also possible to add, as a fining agent, $CeO_2$ or the like up to 5%.

$As_2O_3$ and $Sb_2O_3$ are also effective as fining agents. It is not completely excluded that the alkali-free glass according to this embodiment comprises those components, but it is preferred that those components be not used if their use can be avoided, from an environmental point of view. Further, when $As_2O_3$ is comprised in a large amount in glass, solarization resistance tends to lower. Hence, the content of $As_2O_3$ is preferably 1% or less, 0.5% or less, particularly preferably 0.1% or less, and it is desirable that the glass be substantially free of $As_2O_3$. Herein, the phrase "substantially free of $As_2O_3$" refers to a case where the content of $As_2O_3$ in a glass composition is less than 0.05%. Further, the content of $Sb_2O_3$ is preferably 2% or less, 1% or less, particularly preferably 0.5% or less, and it is desirable that the glass be substantially free of $Sb_2O_3$. Herein, the phrase "substantially free of $Sb_2O_3$" refers to a case where the content of $Sb_2O_3$ in a glass composition is less than 0.05%.

Cl has an effect of promoting the melt of an alkali-free glass, and hence, if Cl is added in glass, a melting temperature can be made lower and the action of a fining agent can be promoted. As a result, it is possible to attain the longer life of a glass production furnace while melting cost is reduced. However, when the content of Cl is too large, the strain point lowers, and hence the content of Cl is preferably 3% or less, 1% or less, particularly preferably 0.5% or less. Note that it is possible to use, as a raw material for introducing Cl, a raw material such as a chloride of an alkaline earth metal, for example, strontium chloride, or aluminum chloride.

ZnO is a component that enhances the meltability. However, when ZnO is comprised in a large amount, the glass is liable to denitrify and the strain point is liable to lower. The content of ZnO is preferably 0 to 5%, 0 to 3%, 0 to 0.5%, particularly preferably 0 to 0.3%, and it is desired that the glass be substantially free of ZnO. Herein, the phrase "substantially free of ZnO" refers to a case where the content of ZnO in a glass composition is 0.2% or less.

$P_2O_5$ is a component that increases the strain point. However, if $P_2O_5$ is comprised in a large amount, the glass is liable to undergo phase separation. The content of $P_2O_5$ is preferably 0 to 1.5%, 0 to 1.2%, particularly preferably 0 to 1%.

TiO$_2$ is a component that lowers the viscosity and enhances the meltability, and is a component that suppresses the solarization. However, if TiO$_2$ is comprised in a large amount, the glass is colored and the transmittance is liable to lower. The content of TiO$_2$ is preferably 0 to 5%, 0 to 3%, 0 to 1%, particularly preferably 0 to 0.02%.

Y$_2$O$_3$, Nb$_2$O$_5$, and La$_2$O$_3$ have functions of increasing the strain point, the Young's modulus, and the like. However, if the content of each of those components is more than 5%, the density is liable to increase.

The alkali-free glass according to this embodiment is preferably formed by an overflow down-draw method. The overflow down-draw method refers to a method involving causing a molten glass to overflow from both sides of a heat-resistant, trough-shaped structure, and subjecting the overflowing molten glasses to down-draw downward at the lower end of the trough-shaped structure while joining them, to thereby produce a glass sheet. When a glass sheet is produced by the overflow down-draw method, surfaces that are to serve as the surfaces of the glass sheet are formed in a state of free surfaces without being brought into contact with the trough-shaped refractory. As a result, it is possible to produce a glass sheet having a good surface quality without polishing at low cost. Note that the structure and material of the trough-shaped structure that is used in the overflow down-draw method are not particularly limited as long as a desired dimension and surface accuracy of the resultant glass sheet can be realized. Further, a method of applying a force to glass at the time of performing down-draw downward is also not particularly limited. For example, there may be adopted a method involving rotating a heat-resistant roll having a sufficiently large width in a state of being in contact with a glass sheet, to thereby draw the glass sheet, or a method involving allowing a plurality of pairs of heat-resistant rolls to come into contact with only the vicinities of end surfaces of a glass sheet, to thereby draw the glass sheet.

It is also possible to form a glass sheet by, for example, a down-draw method (slot down method or the like), a float method, or the like, besides the overflow down-draw method.

The alkali-free glass according to this embodiment is preferably used for OLED devices, in particular, for OLED displays. A manufacturer of panels for OLED displays prepares a plurality of devices on a large-sized glass sheet formed by a glass manufacturer and then cuts the resultant into individual devices, thereby reducing cost (so-called multiple patterning). Particularly in TV applications, the devices themselves have been increased in size, and in order to perform the multiple patterning for those devices, a large-sized glass sheet has been demanded. The alkali-free glass according to this embodiment has a low liquidus temperature and a high liquidus viscosity, and hence can be easily formed into a large-sized glass substrate. Thus, the alkali-free glass can satisfy such demand.

EXAMPLES

Hereinafter, examples of the present invention are described.

Tables 1 and 2 show examples of the alkali-free glass of the present invention (Sample Nos. 1 to 11) and comparative examples (Sample Nos. 12 to 16).

TABLE 1

| | | Example | | | | | | | |
|---|---|---|---|---|---|---|---|---|---|
| | | No. 1 | No. 2 | No. 3 | No. 4 | No. 5 | No. 6 | No. 7 | No. 8 |
| Glass composition (wt %) | SiO$_2$ | 61.4 | 62.4 | 60.9 | 61.4 | 61.4 | 61.4 | 61.4 | 61.4 |
| | Al$_2$O$_3$ | 15.9 | 14.9 | 16.4 | 15.9 | 15.9 | 15.9 | 15.9 | 16.4 |
| | B$_2$O$_3$ | 2.0 | 2.0 | 2.0 | 2.0 | 2.0 | 2.0 | 2.0 | 2.0 |
| | CaO | 9.4 | 9.4 | 9.4 | 8.4 | 7.4 | 8.4 | 7.4 | 8.9 |
| | SrO | 2.0 | 2.0 | 2.0 | 3.0 | 4.0 | 2.0 | 2.0 | 2.0 |
| | BaO | 9.0 | 9.0 | 9.0 | 9.0 | 9.0 | 10.0 | 11.0 | 9.0 |
| | SnO$_2$ | 0.3 | 0.3 | 0.3 | 0.3 | 0.3 | 0.3 | 0.3 | 0.3 |
| Molar ratio | SiO$_2$/Al$_2$O$_3$ | 6.6 | 7.1 | 6.3 | 6.5 | 6.6 | 6.6 | 6.6 | 6.4 |
| | Cao/BaO | 2.9 | 2.9 | 2.9 | 2.6 | 2.3 | 2.3 | 1.8 | 2.7 |
| Density [g/cm$^3$] | | 2.639 | 2.632 | 2.642 | 2.644 | 2.646 | 2.644 | 2.648 | 2.634 |
| CTE [×10$^{-7}$/° C.] | | 44.8 | 44.9 | 45.0 | 44.4 | 43.5 | 44.1 | 43.6 | 44.1 |
| Ps [° C.] | | 716 | 712 | 718 | 716 | 719 | 717 | 720 | 720 |
| Ta [° C.] | | 772 | 768 | 774 | 773 | 777 | 775 | 779 | 777 |
| Ts [° C.] | | 1,002 | 1,000 | 1,003 | 1,008 | 1,016 | 1,011 | 1,020 | 1,011 |
| 10$^4$ dPa·s [° C.] | | 1,327 | 1,329 | 1,326 | 1,338 | 1,347 | 1,345 | 1,360 | 1,342 |
| 10$^3$ dPa·s [° C.] | | 1,498 | 1,503 | 1,496 | 1,512 | 1,522 | 1,520 | 1,536 | 1,515 |
| 10$^{2.5}$ dPa·s [° C.] | | 1,607 | 1,615 | 1,604 | 1,621 | 1,633 | 1,628 | 1,648 | 1,623 |
| TL [° C.] | | 1,158 | 1,187 | 1,186 | 1,170 | 1,179 | 1,158 | 1,159 | 1,190 |
| Log$_{10}$ηTL | | 5.4 | 5.2 | 5.2 | 5.5 | 5.5 | 5.6 | 5.8 | 5.3 |

TABLE 2

| | | Example | | | Comparative Example | | | | |
|---|---|---|---|---|---|---|---|---|---|
| | | No. 9 | No. 10 | No. 11 | No. 12 | No. 13 | No. 14 | No. 15 | No. 16 |
| Glass composition (wt %) | SiO$_2$ | 61.4 | 61.4 | 61.4 | 59.2 | 54.2 | 64.8 | 60.9 | 54.0 |
| | Al$_2$O3 | 16.4 | 15.9 | 15.9 | 15.8 | 20.9 | 16.6 | 15.3 | 17.0 |
| | B$_2$O$_3$ | 2.0 | 1.4 | 1.4 | 1.8 | 8.0 | 0.2 | 9.4 | 0.5 |
| | MgO | — | — | — | 3.0 | — | 0.2 | — | — |
| | CaO | 9.2 | 8.4 | 7.9 | 2.1 | 13.5 | 13.4 | 6.6 | 24.0 |
| | SrO | 1.9 | 2.0 | 2.5 | 17.8 | — | 4.5 | 7.1 | — |
| | BaO | 8.8 | 10.0 | 10.0 | — | 3.1 | — | — | 4.2 |
| | ZnO | — | 0.6 | 0.6 | — | — | — | 0.4 | — |
| | SnO$_2$ | 0.3 | 0.3 | 0.3 | 0.3 | 0.3 | 0.3 | 0.3 | 0.3 |

TABLE 2-continued

|  |  | Example | | | Comparative Example | | | | |
| --- | --- | --- | --- | --- | --- | --- | --- | --- | --- |
|  |  | No. 9 | No. 10 | No. 11 | No. 12 | No. 13 | No. 14 | No. 15 | No. 16 |
| Molar ratio | $SiO_2/Al_2O_3$ | 6.4 | 6.6 | 6.6 | 6.4 | 4.4 | 6.6 | 6.8 | 5.4 |
|  | CaO/BaO | 2.9 | 2.3 | 2.2 | 0.3 | 11.9 | — | — | 15.6 |
| Density [g/cm$^3$] | | 2.631 | 2.660 | 2.663 | — | 2.550 | — | 2.480 | 2.747 |
| CTE [×10$^{-7}$/° C.] | | 44.7 | 44.6 | 44.3 | 42.3 | 44.2 | 45.6 | 38.2 | 61.5 |
| Ps [° C.] | | 720 | 721 | 722 | 724 | 689 | 749 | 666 | 714 |
| Ta [° C.] | | 777 | 778 | 780 | 783 | 737 | 797 | 721 | 751 |
| Ts [° C.] | | 1,009 | 1,013 | 1,017 | 1,032 | 946 | 1,015 | 959 | 911 |
| 10$^4$ dPa·s [° C.] | | 1,338 | 1,342 | 1,350 | 1,371 | 1,216 | 1,314 | 1,292 | 1,122 |
| 10$^3$ dPa·s [° C.] | | 1,509 | 1,516 | 1,524 | 1,544 | 1,356 | 1,475 | 1,460 | 1,242 |
| 10$^{2.5}$ dPa·s [° C.] | | 1,617 | 1,630 | 1,636 | 1,649 | 1,448 | 1,581 | 1,571 | 1,335 |
| TL [° C.] | | 1,196 | 1,184 | 1,183 | 1,248 | 1,228 | >1,250 | >1,250 | >1,250 |
| Log$_{10}$ηTL | | 5.2 | 5.4 | 5.4 | 5.0 | 3.9 | — | — | — |

First, a glass batch prepared by blending glass raw materials so that each glass composition listed in the tables was attained was placed in a platinum crucible, and then melted at 1,600 to 1,650° C. for 24 hours. When the glass batch was dissolved, molten glass was stirred by using a platinum stirrer to homogenize it. Next, the molten glass was poured on a carbon sheet and formed into a glass sheet, followed by annealing for 30 minutes at a temperature close to the annealing temperature. Each of the resultant samples was evaluated for its density, average coefficient of thermal expansion CTE in the temperature range of 30 to 380° C., strain point Ps, annealing temperature Ta, softening temperature Ts, temperature at a viscosity of 10$^4$ dPa·s, temperature at a viscosity of 10$^3$ dPa·s, temperature at a viscosity of 10$^{2.5}$ dPa·s, liquidus temperature TL, and liquidus viscosity Log$_{10}$ηTL.

The density is a value obtained by measurement by the well-known Archimedes method.

The average coefficient of thermal expansion CTE in the temperature range of 30 to 380° C. is a value measured with a dilatometer.

The strain point Ps, the annealing temperature Ta, and the softening temperature Ts are values obtained by measurement based on the method of ASTM C336.

The temperatures at viscosities of 10$^4$ dPa·s, 10$^3$ dPa·s, and 10$^{2.5}$ dPa·s are values obtained by measurement by a platinum sphere pull up method.

The liquidus temperature TL is a value obtained by measuring a temperature at which crystals are deposited after glass powders that passed through a standard 30-mesh sieve (500 μm) and remained on a 50-mesh sieve (300 μm) are placed in a platinum boat and then kept for 24 hours in a gradient heating furnace.

The liquidus viscosity Log$_{10}$ηTL is a value obtained by measuring the viscosity of glass at the liquidus temperature TL by a platinum sphere pull up method.

As apparent from Tables 1 and 2, each of Sample Nos. 1 to 11 is free of alkali metal oxides, and has an average coefficient of thermal expansion CTE in the temperature range of 30 to 380° C. of 40 to 60×10$^{-7}$/° C., a strain point of more than 680° C., and a liquidus temperature of 1,220° C. or less. Therefore, Sample Nos. 1 to 11 are considered as suitable for use as substrates for OLED displays.

On the other hand, each of Sample Nos. 12 to 14 has a high liquidus temperature and low denitrification resistance, and hence is poor in formability. Further, Sample No. 15 has a low coefficient of thermal expansion, which is difficult to match with the coefficient of thermal expansion of a glass sealing material. Hence, stress fracture may occur at a sealing portion. Further, Sample No. 16 has too high a coefficient of thermal expansion, and hence has low thermal shock resistance, which may reduce the throughput of a panel production process.

INDUSTRIAL APPLICABILITY

The alkali-free glass of the present invention may be suitably used for, for example, a flat panel display substrate for a liquid crystal display, an OLED display, or the like, a cover glass for an image sensor such as a charge coupled device (CCD) or a contact image sensor (CIS), a substrate and cover glass for a solar cell, and a substrate for an OLED lighting device, and in particular, may be suitably used as a substrate for an OLED display.

The invention claimed is:

1. An alkali-free glass, which is substantially free of alkali metal oxides, and has a strain point of more than 680° C., an average coefficient of thermal expansion in a temperature range of 30 to 380° C. of 40×10$^{-7}$/° C. to 55×10$^{-7}$/° C., and a liquidus temperature of less than 1,220° C., wherein the alkali-free glass comprises, as a glass composition in terms of mass %, 55 to 70% of $SiO_2$, 10 to 20% of $Al_2O_3$, 0.1 to 4.5% of $B_2O_3$, 0 to 0.8% of MgO, 5 to 12% of CaO, 0.5 to 5% of SrO, and 5 to 15% of BaO, wherein the alkali-free glass has a molar ratio $SiO_2/Al_2O_3$ of 6.3 to 8.

2. The alkali-free glass according to claim 1, wherein the alkali-free glass comprises, as a glass composition in terms of mass %, 55 to 70% of $SiO_2$, 14 to 20% of $Al_2O_3$, 0.1 to 4.5% of $B_2O_3$, 0 to 0.8% of MgO, 5 to 12% of CaO, 0.5 to 5% of SrO, and 5 to 15% of BaO.

3. The alkali-free glass according to claim 1, wherein the alkali-free glass has a molar ratio $SiO_2/Al_2O_3$ of 6.3 to 6.8.

4. The alkali-free glass according to claim 1, wherein the alkali-free glass has a molar ratio CaO/BaO of 0.5 to 10.

5. The alkali-free glass according to claim 1, wherein the alkali-free glass further comprises 0.001 to 1 mass % of $SnO_2$.

6. The alkali-free glass according to claim 1, wherein the alkali-free glass has a temperature at 10$^{2.5}$ poise of 1,660° C. or less.

7. The alkali-free glass according to claim 1, wherein the alkali-free glass has a viscosity at a liquidus temperature of 10$^{4.8}$ poise or more.

8. The alkali-free glass according to claim 1, wherein the alkali-free glass is formed by an overflow down-draw method.

9. The alkali-free glass according to claim 1, wherein the alkali-free glass is used for an OLED device.

10. The alkali-free glass according to claim 2, wherein the alkali-free glass has a molar ratio $SiO_2/Al_2O_3$ of 6.3 to 6.8.

11. The alkali-free glass according to claim 2, wherein the alkali-free glass has a molar ratio CaO/BaO of 0.5 to 10.

12. The alkali-free glass according to claim 2, wherein the alkali-free glass further comprises 0.001 to 1 mass % of $SnO_2$.

13. The alkali-free glass according to claim 2, wherein the alkali-free glass has a temperature at $10^{2.5}$ poise of 1,660° C. or less.

14. The alkali-free glass according to claim 2, wherein the alkali-free glass has a viscosity at a liquidus temperature of $10^{4.8}$ poise or more.

15. The alkali-free glass according to claim 2, wherein the alkali-free glass is formed by an overflow down-draw method.

16. The alkali-free glass according to claim 2, wherein the alkali-free glass is used for an OLED device.

\* \* \* \* \*